(12) United States Patent
Sun et al.

(10) Patent No.: US 11,647,580 B2
(45) Date of Patent: May 9, 2023

(54) FLEXIBLE PRINTED CIRCUIT, FLEXIBLE APPARATUS AND DISPLAY DEVICE

(71) Applicant: BOE Technology Group Co., Ltd., Beijing (CN)

(72) Inventors: Baofeng Sun, Beijing (CN); Shangchieh Chu, Beijing (CN); Zewen Bo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 120 days.

(21) Appl. No.: 16/767,468

(22) PCT Filed: Jun. 28, 2019

(86) PCT No.: PCT/CN2019/093861
§ 371 (c)(1),
(2) Date: May 27, 2020

(87) PCT Pub. No.: WO2020/258295
PCT Pub. Date: Dec. 30, 2020

(65) Prior Publication Data
US 2021/0410270 A1   Dec. 30, 2021

(51) Int. Cl.
*H05K 1/02* (2006.01)
*G06F 3/041* (2006.01)
*H10K 59/40* (2023.01)
*H10K 77/10* (2023.01)
*H05K 1/09* (2006.01)
*H01L 27/32* (2006.01)
(Continued)

(52) U.S. Cl.
CPC ........... *H05K 1/028* (2013.01); *G06F 3/0412* (2013.01); *H01L 27/323* (2013.01); *H01L 51/0097* (2013.01); *H05K 1/092* (2013.01); *G06F 3/044* (2013.01); *G06F 2203/04102* (2013.01); *H01L 2251/5338* (2013.01); *H05K 2201/09063* (2013.01); *H05K 2201/10128* (2013.01)

(58) Field of Classification Search
CPC ................... H05K 1/028; H05K 1/092; H05K 2201/09063; H05K 2201/10128; G06F 3/0412; G06F 3/044; G06F 2203/04102; H01L 27/323; H01L 51/0097; H01L 2251/5338
See application file for complete search history.

(56) References Cited

U.S. PATENT DOCUMENTS

2007/0034402 A1   2/2007  Cheng
2010/0202119 A1*  8/2010  Nagami .............. H05K 1/0281
                                                            361/749
(Continued)

FOREIGN PATENT DOCUMENTS

| CN | 202018547 U | * | 10/2011 |
| CN | 202018547 U |   | 10/2011 |

(Continued)

*Primary Examiner* — David D Davis
(74) *Attorney, Agent, or Firm* — ArentFox Schiff LLP; Michael Fainberg (57) ABSTRACT

Disclosed are a flexible printed circuit, a flexible apparatus and a display device. The flexible printed circuit includes: a circuit bonding region, a flat and straight region, and a bent region located between the circuit bonding region and the flat and straight region; where the bent region has an opening structure.

14 Claims, 6 Drawing Sheets

(51) Int. Cl.
*H01L 51/00* (2006.01)
*G06F 3/044* (2006.01)
*H10K 102/00* (2023.01)

(56) References Cited

U.S. PATENT DOCUMENTS

| | | | | |
|---|---|---|---|---|
| 2011/0187965 | A1* | 8/2011 | Ooishi | G09F 13/04 |
| | | | | 361/749 |
| 2015/0077950 | A1* | 3/2015 | Tashiro | H05K 1/0281 |
| | | | | 361/749 |
| 2015/0189755 | A1* | 7/2015 | Choi | G02F 1/13452 |
| | | | | 361/749 |

FOREIGN PATENT DOCUMENTS

| | | | |
|---|---|---|---|
| CN | 105636339 | A | 6/2016 |
| CN | 109859632 | A | 6/2019 |
| JP | 2005183496 | A * | 7/2005 |

* cited by examiner

FLEXIBLE PRINTED CIRCUIT, FLEXIBLE APPARATUS AND DISPLAY DEVICE

The present disclosure is a US National Stage of International Application No. PCT/CN2019/093861, filed on Jun. 28, 2019, which is hereby incorporated by reference in its entireties.

FIELD

The present disclosure relates to the technical field of circuits, and more particularly relates to a flexible printed circuit, a flexible apparatus and a display device.

BACKGROUND

A flexible printed circuit (FPC) often needs to be bent in an application process, which results in stress in the flexible printed circuit in a bent region. Due to the action of the stress, the bent flexible printed circuit has a greater upwarp risk, which is not conducive to assembling and transportation of a module including the flexible printed circuit.

SUMMARY

An embodiment of the present disclosure provides a flexible printed circuit, including:
  a circuit bonding region;
  a flat and straight region; and
  a bent region, arranged between the circuit bonding region and the flat and straight region;
  where the bent region has an opening structure.

Optionally, in the embodiment of the present disclosure, the circuit bonding region, the bent region and the flat and straight region are arranged along a first direction, and extend along a second direction; where the first direction and the second direction are different.

Optionally, in the embodiment of the present disclosure, the opening structure includes a plurality of first opening structures; and
  orthographic projections of the plurality of first opening structures on the flexible printed circuit are in the bent region.

Optionally, in the embodiment of the present disclosure, the plurality of first opening structures are arranged in an array, or the plurality of first opening structures are arranged in a straight line along the second direction.

Optionally, in the embodiment of the present disclosure, the opening structure includes at least one second opening structure group;
  each of the at least one second opening structure group includes two second opening structures;
  the two second opening structures in the each second opening structure group are oppositely disposed at edges of the bent region in the second direction.

Optionally, in the embodiment of the present disclosure, the opening structure includes a plurality of third opening structures; and
  the plurality of third opening structures extend along the first direction from the bent region into the circuit bonding region.

Optionally, in the embodiment of the present disclosure, the opening structure includes a plurality of fourth opening structures;
  the plurality of fourth opening structures extend along the first direction from the bent region to an edge, which deviates from the bent region, of the circuit bonding region.

Optionally, in the embodiment of the present disclosure, the flexible printed circuit includes: a flexible circuit substrate; and the opening structure penetrates the flexible circuit substrate.

Optionally, in the embodiment of the present disclosure, the flexible printed circuit further includes: line layers arranged on the flexible circuit substrate; and
  an orthographic projection of the opening structure on the flexible printed circuit and orthographic projections of the line layers on the flexible printed circuit do not overlap.

Optionally, in the embodiment of the present disclosure, a thickness of the flexible printed circuit in the bent region is less than a thickness of the flexible printed circuit in the flat and straight region.

Optionally, in the embodiment of the present disclosure, the line layers are arranged on the circuit bonding region, the bent region and the flat and straight region of the flexible printed circuit; and
  a quantity of the line layers in the bent region is less than a quantity of the line layers in the flat and straight region.

Optionally, in the embodiment of the present disclosure, the flexible printed circuit further includes: ink layers arranged on sides, which deviate from the flexible circuit substrate, of the line layers.

An embodiment of the present disclosure further provides a flexible apparatus, including: the above flexible printed circuit.

Optionally, in the embodiment of the present disclosure, the flexible apparatus further includes: a flexible target substrate having a substrate bonding region, and the circuit bonding region of the flexible printed circuit is electrically connected to the substrate bonding region.

Optionally, in the embodiment of the present disclosure, the flexible target substrate further includes: sunken structures close to two sides of the circuit bonding region of the flexible printed circuit in the second direction.

Optionally, in the embodiment of the present disclosure, the flexible target substrate further includes: a display region and a touch electrode arranged in the display region.

Optionally, in the embodiment of the present disclosure, the flexible apparatus further includes: a flexible electroluminescent display panel.
  where the flexible target substrate is arranged on the light emitting side of the flexible electroluminescent display panel; or
  the flexible target substrate is an array substrate in the flexible electroluminescent display panel.

An embodiment of the present disclosure further provides a display device, including: the above flexible apparatus.

DETAILED DESCRIPTION OF THE EMBODIMENTS

In order to make the objectives, technical solutions and advantages of the embodiments of the present disclosure clearer, the technical solutions in the embodiments of the present disclosure are described clearly and completely below in conjunction with the accompanying drawings in the embodiments of the present disclosure. Obviously, the described embodiments are a part of the embodiments of the present disclosure, not all the embodiments. Furthermore, the embodiments in the present disclosure and features in the embodiments may be combined with each other without conflicts. Based on the described embodiments of the present disclosure, all other embodiments obtained by those of ordinary skill in the art without creative work shall fall within the protection scope of the present disclosure.

Unless otherwise defined, technical terms or scientific terms used in the present disclosure shall be ordinary meanings as understood by those of ordinary skill in the art of the present disclosure. The words "first", "second" and similar terms used in the present disclosure do not denote any order, quantity or importance, but are merely used to distinguish different components. The word "including" or "includes" or the like means that the element or item preceding the word covers the element or object listed after the word and its equivalent, without excluding other elements or objects. The words "connection" or "connected" and the like are not limited to physical or mechanical connections, but may include electrical connections, whether direct or indirect.

It should be noted that the sizes and shapes of all patterns in the drawings do not reflect real scales, and are merely to illustrate the contents of the present disclosure. Furthermore, same or similar numerals throughout indicate same or similar elements or elements with same or similar functions.

Generally, a flexible printed circuit will be assembled in a display device to transmit a signal through the flexible printed circuit. Line layers used for transmitting signals, an insulation layer and a protective layer may be disposed on the flexible printed circuit. When the flexible printed circuit is bent, stress occurs in a bent region, so that the above film layers are squeezed by the stress, which may result in a relatively great upwarp risk of the bent flexible printed circuit, thus causing the surface of the flexible printed circuit to be not flat and being not conductive to assembling and transportation of a module including the flexible printed circuit.

Based on this, an embodiment of the present disclosure provides some flexible printed circuits used for lowering the adverse effects caused by the stress generated during the bending.

Figure 1:
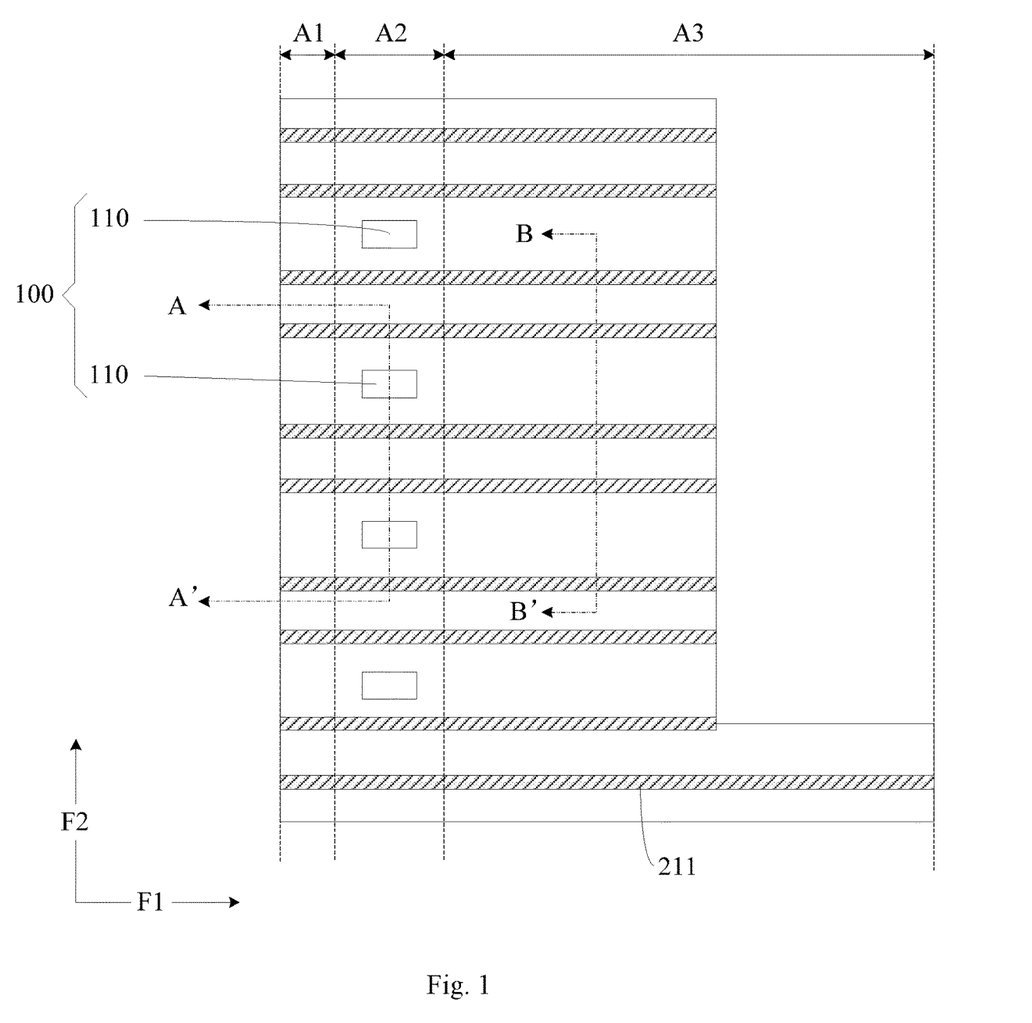
FIG. 1 is a schematic diagram of a top-view structure of some flexible printed circuits provided by the embodiment of the present disclosure.
Figure 2A:
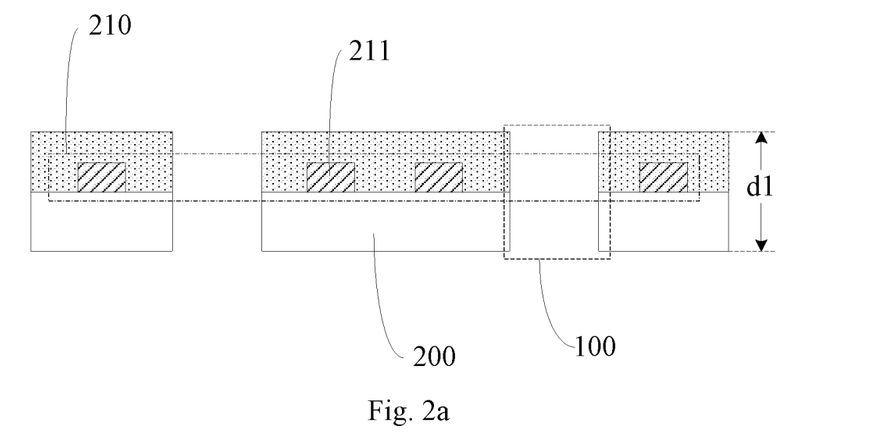
FIG. 2a is a schematic diagram of a sectional structure of the flexible printed circuit shown in FIG. 1 along a direction AA'.
Figure 2B:
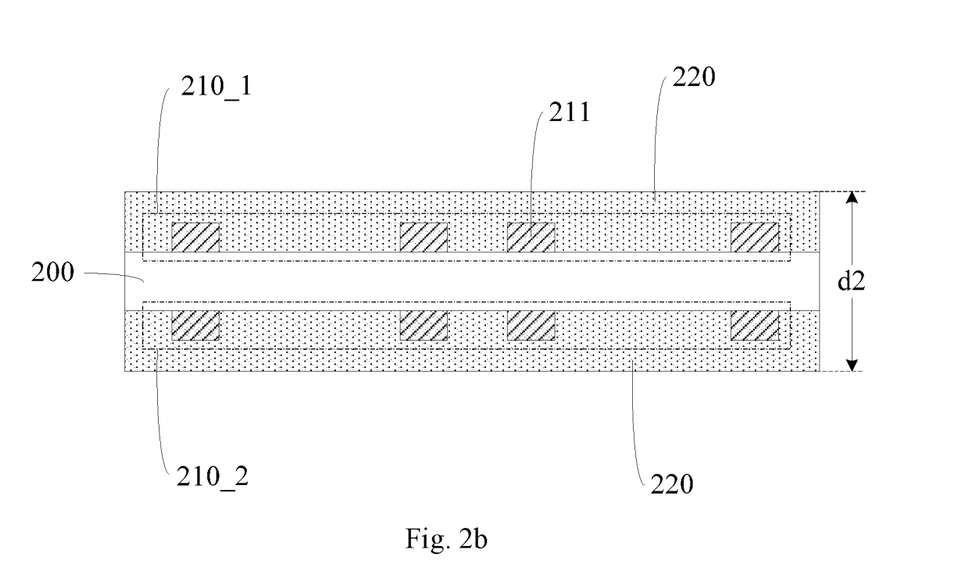
FIG. 2b is a schematic diagram of a sectional structure of the flexible printed circuit shown in FIG. 1 along a direction BB'.

The embodiment of the present disclosure provides some flexible printed circuits, as shown in FIG. 1 to FIG. 2b. The flexible printed circuit may include: a circuit bonding region A1, a bent region A2 and a flat and straight region A3. The bent region A2 is located between the circuit bonding region A1 and the flat and straight region A3, and the bent region A2 has an opening structure 100.

According to the flexible printed circuit provided by the embodiment of the present disclosure, the bent region is located between the circuit bonding region and the flat and straight region, so as to electrically connect the circuit bonding region and the flat and straight region through the bent region. By causing the bent region to have the opening structure, when the bent region of the flexible printed circuit is bent, since the relatively high stress generated during the bending may be transferred to the opening structure and be released through the opening structure, the degree of squeezing the film layers on the flexible printed circuit by the stress may be lowered, thus reducing the upwarp risk of the bent region during the bending, improving the surface flatness, increasing the bending success rate and improving the production yield of products.

It should be noted that the circuit bonding region of the flexible printed circuit has pins (PIN). When the flexible printed circuit and an apparatus are assembled, the pins in the circuit bonding region and the apparatus to be assembled (such as a display panel) are electrically connected via bonding.

In specific implementation, in the embodiment of the present disclosure, as shown in FIG. 1, the circuit bonding region A1, the bent region A2 and the flat and straight region A3 are arranged along a first direction F1; and the circuit bonding region A1, the bent region A2 and the flat and straight region A3 extend along a second direction F2, respectively. The first direction F1 and the second direction F2 are different. Exemplarily, the first direction F1 and the second direction F2 may be set to be perpendicular. Of course, in actual application, the first direction F1 and the second direction F2 may be designed and determined according to an actual application environment, which is not limited here.

In specific implementation, in the embodiment of the present disclosure, as shown in FIG. 1 to FIG. 2b, the flexible printed circuit may include: a flexible circuit substrate 200. The opening structure 100 penetrates the flexible circuit substrate 200. In this way, the stress generated by the flexible circuit substrate 200 during the bending may be released through the opening structure 100 to lower the degree of squeezing the film layers on the flexible printed circuit by the stress, reduce the upwarp risk during the bending, improve the surface flatness, increase the bending success rate and improve the production yield of the products.

In specific implementation, in the embodiment of the present disclosure, as shown in FIG. 1 to FIG. 2b, the flexible printed circuit may further include: line layers 210 located on the flexible circuit substrate 200. An orthographic projection of the opening structure 100 on the flexible printed circuit and orthographic projections of the line layers 210 on the flexible printed circuit do not overlap. In this way, the influence on lines in the line layers 210, which is caused by the opening structure 100, may be avoided. Exemplarily, the orthographic projection of the opening structure 100 on the flexible circuit substrate 200 and the orthographic projections of the line layers 210 on the flexible printed circuit do not overlap. Further, the line layers 210 may include a plurality of mutually independent lines 211, and these lines 211 may be used for transmitting signals.

In specific implementation, in the embodiment of the present disclosure, as shown in FIG. 1, the line layers 210 are located on the circuit bonding region A1, the bent region A2 and the flat and straight region A3 of the flexible printed circuit. Exemplarily, the material of the lines in the line layers 210 may include a metal material, such as Au, Ag, Au and the like.

In specific implementation, in the embodiment of the present disclosure, as shown in FIG. 1 to FIG. 2b, a thickness d1 of the flexible printed circuit in the bent region A2 is less than a thickness d2 of the flexible printed circuit in the flat and straight region A3. In this way, the stress in the bent region may be further reduced.

In specific implementation, in the embodiment of the present disclosure, as shown in FIG. 1 to FIG. 2b, the number of the line layers 210 in the bent region A2 is less than the number of the line layers 210 in the flat and straight region A3. Exemplarily, there may be one line layer 210 disposed in the bent region A2, that is, the line layer 210 in the bent region A2 is located on a side of the flexible circuit substrate 200 only. Furthermore, two line layers 210 may be disposed in the flat and straight region A3, and the two line layers are a line layer 210_1 located on one side of the flexible circuit substrate 200 and a line layer 210_2 located on the other side of the flexible circuit substrate 200. In this way, the thickness d1 of the flexible printed circuit in the bent region A2 is less than the thickness d2 of the flexible printed circuit in the flat and straight region A3. Furthermore, two line layers 210 may be disposed in the flat and straight region A3, so as to enlarge the arrangement space of the lines and reduce the resistance.

In specific implementation, in the embodiment of the present disclosure, as shown in FIG. 2a and FIG. 2b, the flexible printed circuit may further include: ink layers 220 located on sides, which deviate from the flexible circuit substrate 200, of the line layers 210. In this way, the line layers may be protected through the ink layers 220. Furthermore, since the material of the ink layers is ink which is soft and relatively good in ductility, the formed ink layers may be relatively thin, and the degree of squeezing the film layers by the stress may be further lowered, thus reducing the upwarp risk of the bent region during the bending, improving the surface flatness, increasing the bending success rate and improving the production yield of the products.

In specific implementation, in the embodiment of the present disclosure, as shown in FIG. 1, the opening structure 100 may include a plurality of first opening structures 110. Orthographic projections of the plurality of first opening structures 110 on the flexible printed circuit are in the bent region A2. Further, the plurality of first opening structures may be uniformly dispersed in the bent region A2, so that the stress may be released uniformly. Exemplarily, as shown in FIG. 1, the first opening structures 110 may be arranged in a straight line along the second direction F2. Exemplarily, the plurality of first opening structures may also be arrayed in the bent region. Further, the space between at least two adjacent first opening structures 110 may be set to be same. For example, the space between every two adjacent first opening structures 110 may be set to be same. Of course, in the actual application, the first opening structures may be randomly dispersed in the bent region, which is not limited here.

Figure 3:
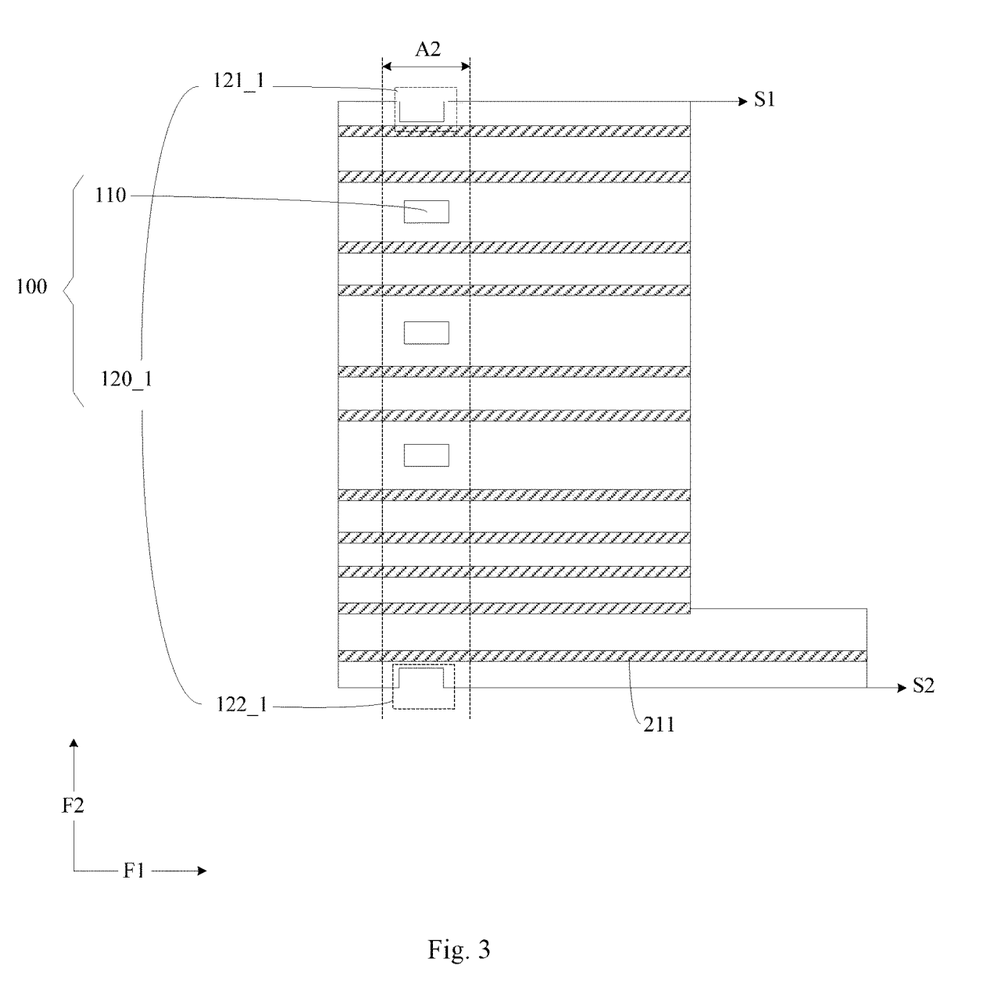
FIG. 3 is a schematic diagram of a top-view structure of some other flexible printed circuits provided by the embodiment of the present disclosure.

In specific implementation, in the embodiment of the present disclosure, as shown in FIG. 3, the opening structure 100 also includes at least one second opening structure group 120_m (m is more than or equal to 1 and less than or equal to M, m and M are both positive integers, and M represents the total number of the second opening structure groups). Furthermore, each of the at least one second opening structure group 120_m may include two second opening structures 121_m and 122_m. Exemplarily, as shown in FIG. 3, M may be set to be equal to 1, so that the opening structure 100 may include one second opening structure group 120_1. M may also be set to be equal to 2, so that the opening structure 100 may include two second opening structure groups 120_1 and 120_2. M may also be set to be equal to 3, so that the opening structure 100 may include three second opening structure groups 120_1, 120_2 and 120_3. Of course, the value of M may be designed and determined according to an actual application environment, which is not limited here.

In specific implementation, in the embodiment of the present disclosure, as shown in FIG. 3, the two second opening structures 121_m and 122_m in a same second opening structure group 120_m are oppositely disposed at the edges of the bent region A2 in the second direction F2. Exemplarily, the second opening structure 121_1 is disposed at one edge S1 of the bent region A2 in the second direction F2, and the second opening structure 122_1 is disposed at the other edge S2 of the bent region A2 in the second direction F2. Furthermore, the second opening structure 121_1 and the second opening structure 122_1 are arranged in a straight line along the second direction F2.

Figure 4:
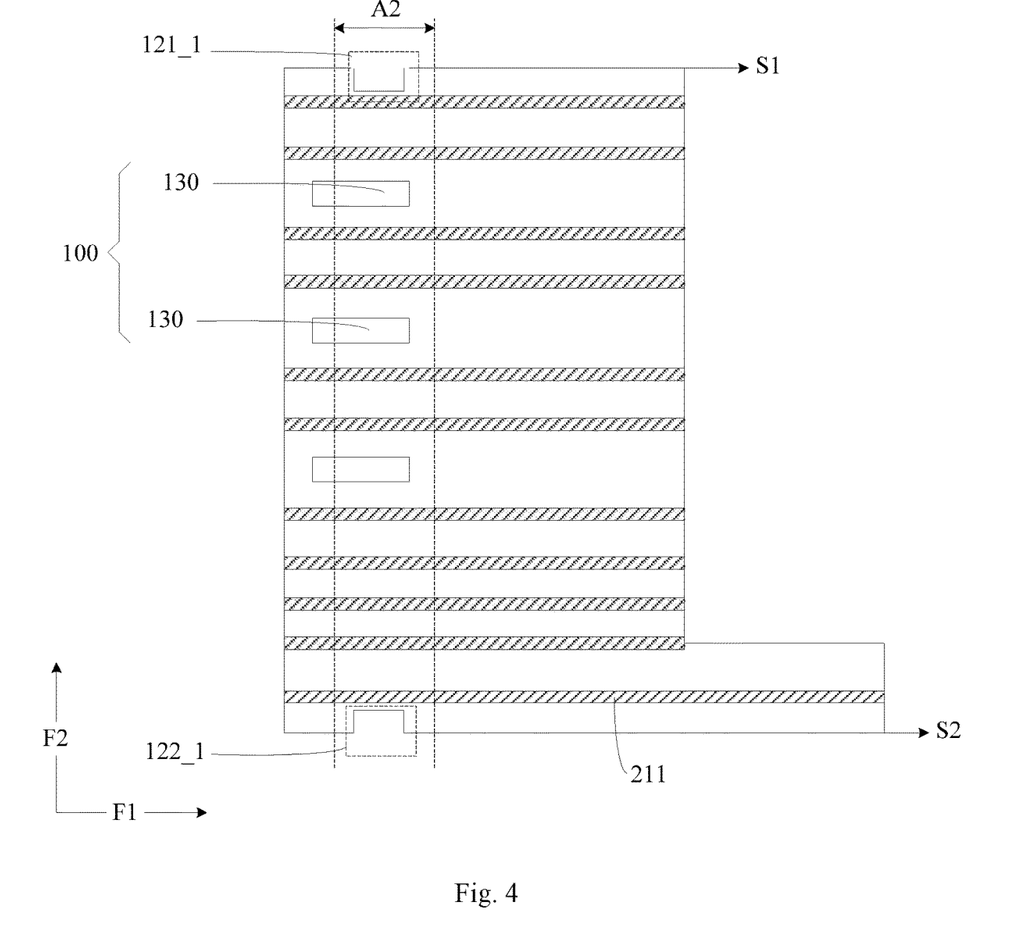
FIG. 4 is a schematic diagram of a top-view structure of some other flexible printed circuits provided by the embodiment of the present disclosure.

In specific implementation, in the embodiment of the present disclosure, as shown in FIG. 4, the opening structure 100 may also include a plurality of third opening structures 130. The third opening structures 130 extend along the first direction F1 from the bent region A2 into the circuit bonding region A1. Exemplarily, the third opening structures 130 may be arranged in a straight line along the second direction F2.

Figure 5:
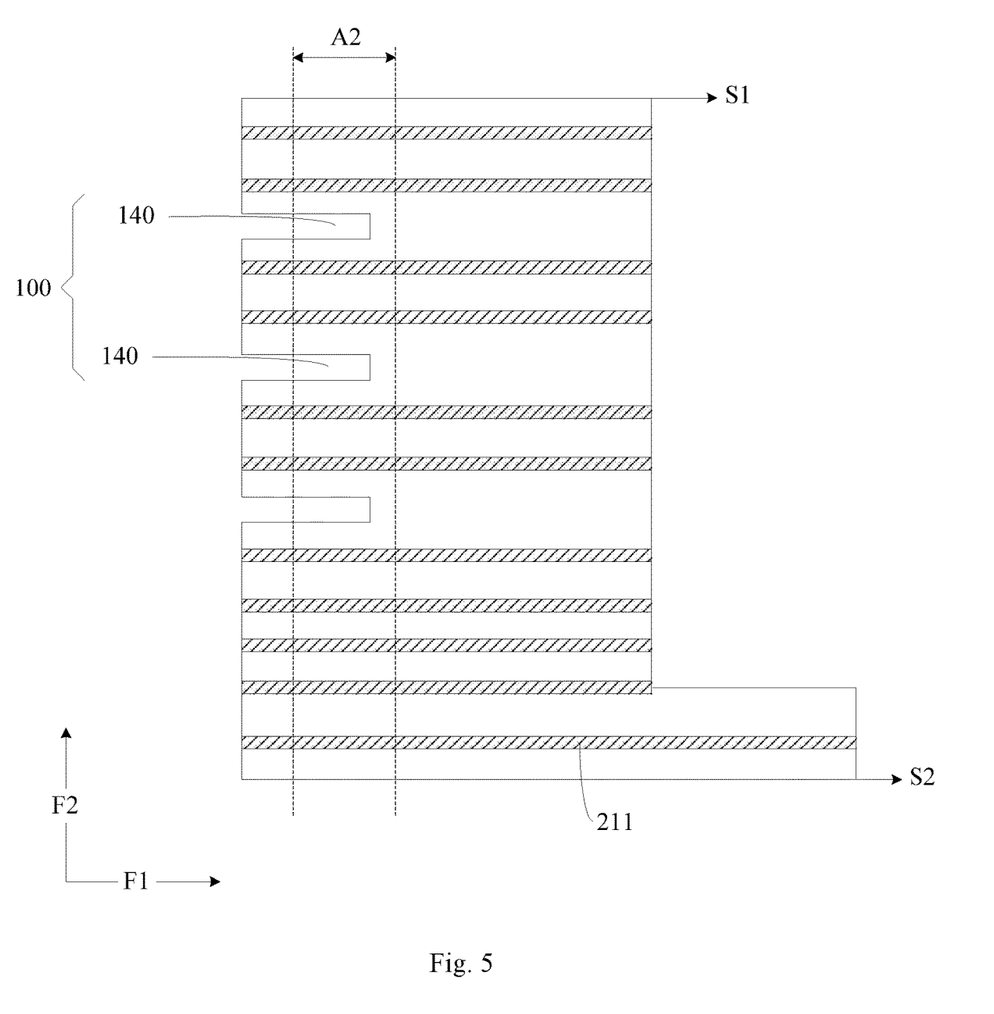
FIG. 5 is a schematic diagram of a top-view structure of some other flexible printed circuits provided by the embodiment of the present disclosure.

In specific implementation, in the embodiment of the present disclosure, as shown in FIG. 5, the opening structure 100 may also include a plurality of fourth opening structures 140. The plurality of fourth opening structures 140 extend along the first direction F1 from the bent region A2 to an edge of, which deviates from the bent region A2, of the circuit bonding region A1. Exemplarily, the fourth opening structures 140 may be arranged in a straight line along the second direction F2.

In specific implementation, in the embodiment of the present disclosure, the abovementioned first opening structures 110, the second opening structures 121_m and 122_m, the third opening structures 130 and the fourth opening structures 140 may be randomly combined, thus further reducing the stress. Exemplarily, as shown in FIG. 4, the second opening structures 121_m and 122_m and the first opening structures 110 may be combined. As shown in FIG. 4, the second opening structures 121_m and 122_m and the third opening structures 130 may be combined.

It should be noted that if the number of the abovementioned opening structures is larger, the effect of releasing the stress by the opening structures is better. However, a flexible printed circuit is relatively small in size generally, and lines, circuits and the like need to be disposed on the flexible printed circuit, so that in order to avoid the influence on the signal transmission of the flexible printed circuit, the number of the opening structures is reduced as far as possible on the basis of meeting stress release.

Based on the same inventive concept, an embodiment of the present disclosure further provides a flexible apparatus, which may include the above flexible printed circuit provided by the embodiment of the present disclosure. The principle of the flexible apparatus for solving problems is similar to that of the foregoing flexible printed circuit, so that the implementation of the flexible apparatus may refer to the implementation of the foregoing flexible printed circuit, and repeated descriptions will be omitted here.

Furthermore, the structure of the flexible printed circuit may refer to the above embodiment, and repeated descriptions will be omitted here. Illustration will be carried out below by taking the structure of the flexible printed circuit shown in FIG. 5 as an example.

Figure 6:
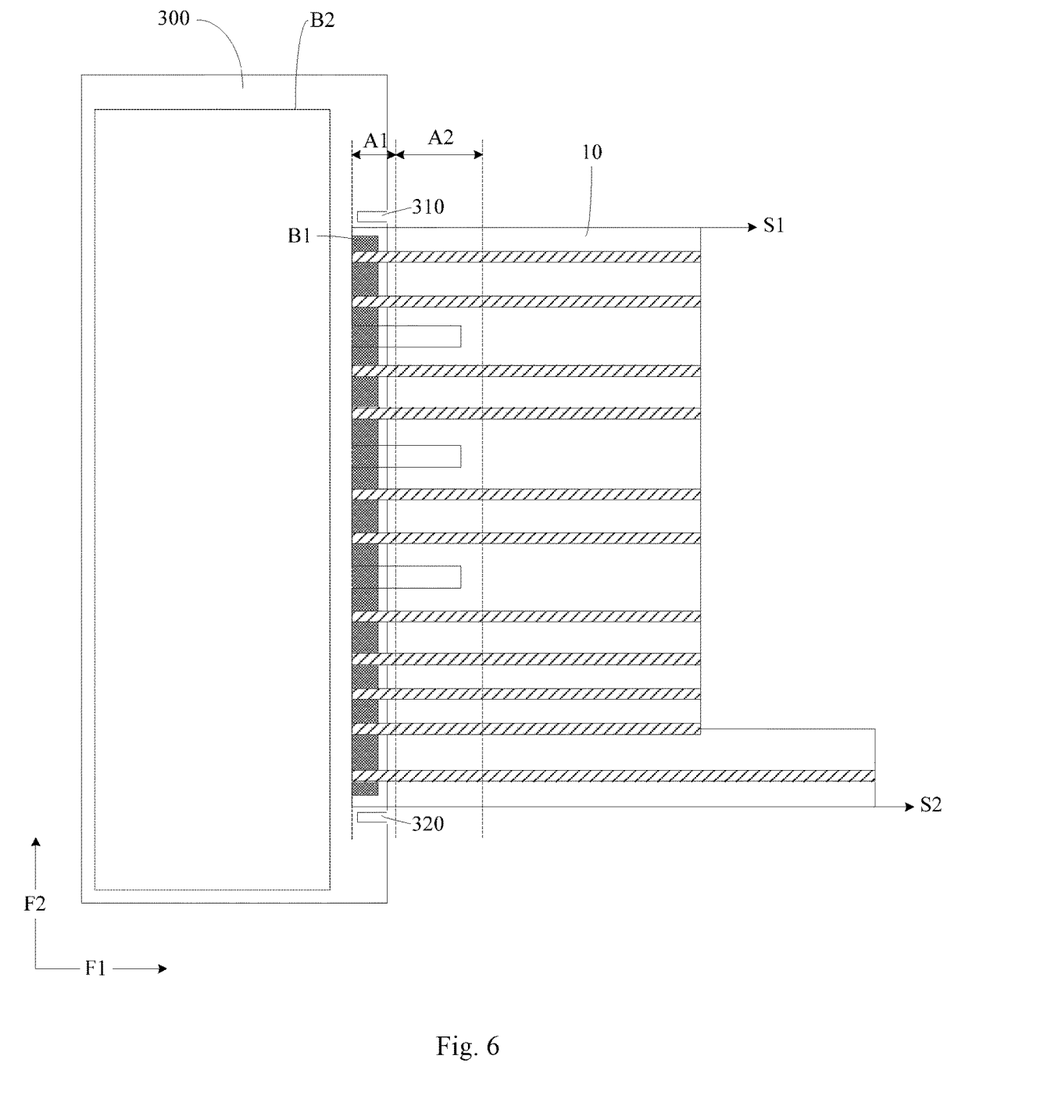
FIG. 6 is a schematic diagram of a top-view structure of a flexible apparatus provided by the embodiment of the present disclosure.

In specific implementation, in the embodiment of the present disclosure, as shown in FIG. 6, the flexible apparatus may further include: a flexible target substrate 300 having a substrate bonding region B1. The circuit bonding region A1 of the flexible printed circuit 10 is electrically connected to the substrate bonding region B1. Exemplarily, the substrate bonding region B1 of the flexible target substrate 300 may have a plurality of metal terminals (PADs), so that PINs in the circuit bonding region A1 of the flexible printed circuit 10 may be electrically connected to the PADs through a bonding process.

In specific implementation, as shown in FIG. 6, the substrate bonding region B1 may extend along the second direction F2. In the embodiment of the present disclosure, the flexible target substrate 300 further includes: sunken structures 310 and 320 close to two sides of the circuit bonding region A1 of the flexible printed circuit 10 in the second direction F2. Exemplarily, the sunken structures 310 and 320 are respectively located on the flexible target substrate 300, and are respectively located on two sides of the substrate bonding region B1. For example, the sunken structure 310 is close to one side S1 of the circuit bonding region A1 in the second direction F2, and the sunken structure 320 is close to the other side S2 of the circuit bonding region A1 in the second direction F2. In this way, the flexible target substrate 300 is provided with the sunken structures, so that the connection between the substrate bonding region B1 and the two sides of the flexible target substrate 300 in the second direction F2 is cut off. Therefore, the acting force of the flexible printed circuit on the substrate bonding region B1 may be reduced. When bent, the flexible printed circuit may no longer lift the edge of the flexible target substrate 300, so that after the flexible apparatus is packaged, the flatness of the flexible apparatus may be further improved.

In specific implementation, in the embodiment of the present disclosure, the flexible target substrate may further include: a display region B2 and a touch electrode located in the display region B2, so that the flexible target substrate may be a touch substrate. Exemplarily, the touch electrode may be a self-capacitive electrode, so that the flexible target substrate may achieve a touch effect through a self-capacitive technology. The touch electrode may also be a mutual-capacitive electrode, so that the flexible target substrate may achieve a touch effect through a mutual-capacitive technology. The touch electrode may also be a 3D touch electrode, so that the flexible target substrate may achieve a touch effect through a 3D touch technology.

Exemplarily, in specific implementation, in the embodiment of the present disclosure, the flexible apparatus may further include: a flexible electroluminescent display panel. The flexible target substrate is located on a light emitting side of the flexible electroluminescent display panel. In this way, the flexible target substrate and the flexible electroluminescent display panel may be assembled by means of external hanging, so that the assembled flexible apparatus may realize a display function and a touch function. Generally, after the flexible printed circuit is assembled, the bent region of the flexible printed circuit may be bent to bend the flexible printed circuit to the back surface of the display panel. Then, the assembled flexible apparatus may also be packaged. Since the stress of the flexible printed circuit may be released through openings, the upwarp risk of the flexible printed circuit may be lowered, thus improving the flatness of the flexible apparatus after packaging.

The flexible electroluminescent display panel may include an array substrate and an opposite substrate disposed oppositely. The array substrate may include a plurality of pixel units, and each pixel unit may include a plurality of sub-pixels. The sub-pixels may include electroluminescent diodes and pixel circuits used for driving the electroluminescent diodes to emit light. Further, the electroluminescent diodes may include: at least one of an organic light emitting diode (OLED), a micro light emitting diode (Micro-LED), and a quantum dot light emitting diode (QLED). Generally, the pixel circuits may include a plurality of transistors such as driving transistors and switch transistors, and storage capacitors. The specific structure and the working principle of each pixel circuit may be the same as those in the related art, and repeated descriptions will be omitted here.

Exemplarily, in specific implementation, in the embodiment of the present disclosure, the flexible target substrate may also be set as an array substrate in the flexible electroluminescent display panel. In this way, the touch electrode may be formed inside the flexible electroluminescent display panel by means of embedding (for example, the touch electrode is disposed in the space of the sub-pixels of the array substrate of the flexible electroluminescent display panel), so that the flexible electroluminescent display panel may realize the display function and the touch function. Generally after the flexible printed circuit is assembled, the bent region of the flexible printed circuit may be bent to bend the flexible printed circuit to the back surface of the display panel. Then, the assembled flexible apparatus may also be packaged. Since the stress of the flexible printed circuit may be released through openings, the upwarp risk of the flexible printed circuit may be lowered, thus improving the flatness of the flexible apparatus after packaging.

Based on the same inventive concept, the embodiment of the present disclosure further provides a display device, including the above flexible apparatus provided by the embodiment of the present disclosure. The principle of the display device for solving problems is similar to that of the foregoing flexible apparatus, so that the implementation of the display device may refer to the implementation of the flexible apparatus, and repeated descriptions will be omitted here.

In specific implementation, in the embodiment of the present disclosure, the display device may be: any product or component having a display function, such as a mobile phone, a tablet computer, a television, a display, a notebook computer, a digital photo frame and a navigator. Other indispensable components of the display device are all understood by those skilled in the art, are not described repeatedly herein and should not be construed as limiting the present disclosure.

According to the flexible printed circuit, the flexible apparatus and the display device provided by the embodiment of the present disclosure, the bent region is located between the circuit bonding region and the flat and straight region, so as to electrically connect the circuit bonding region and the flat and straight region through the bent region. By arranging the opening structure in the bent region, when the bent region of the flexible printed circuit is bent, since the relatively high stress generated during the bending may be transferred to the opening structure and be released through the opening structure, the degree of squeezing the film layers on the flexible printed circuit by the stress may be lowered, thus reducing the upwarp risk of the bent region during the bending, improving the surface flatness, increasing the bending success rate and improving the production yield of products.

Although the preferred embodiments of the present disclosure have been described, those skilled in the art can make other changes and modifications to these embodiments once they acquire the basic creative concept. Therefore, attached claims are intended to be explained as including the preferred embodiments and all the changes and modifications that fall within the scope of the present disclosure.

Apparently, those skilled in the art can make various changes and modifications to the embodiments of the present disclosure without departing from the spirits and scopes of the embodiments of the present disclosure. Therefore, if these changes and modifications of the present disclosure fall within the scope of the claims of the present disclosure and equivalent technologies of the present disclosure, the present disclosure is intended to include these changes and modifications.

What is claimed is:

1. A flexible printed circuit, comprising:
   a circuit bonding region;
   a flat and straight region; and
   a bent region, arranged between the circuit bonding region and the flat and straight region; wherein the circuit bonding region, the bent region and the flat and straight region are arranged along a first direction, and extend along a second direction;
   wherein the first direction and the second direction are different;
   wherein the bent region has an opening structure;
   wherein the opening structure comprises a plurality of first opening structures;
   wherein the opening structure comprises at least one second opening structure group;
   each of the at least one second opening structure group comprises two second opening structures; and the two second opening structures in the each second opening structure group are oppositely disposed at first edges of the bent region in the second direction;
   wherein the opening structure comprises a plurality of third opening structures; and the plurality of third opening structures extend along the first direction from the bent region into the circuit bonding region;
   wherein the opening structure comprises a plurality of fourth opening structures; and the plurality of fourth opening structures extend along the first direction from the bent region to a second edge, which deviates from the bent region, of the circuit bonding region.

2. The flexible printed circuit according to claim 1, wherein orthographic projections of the plurality of first opening structures on the flexible printed circuit are in the bent region.

3. The flexible printed circuit according to claim 2, wherein the plurality of first opening structures are arranged in an array, or the plurality of first opening structures are arranged in a straight line along the second direction.

4. The flexible printed circuit according to claim 1, wherein the flexible printed circuit further comprises: line layers arranged on the flexible circuit substrate; and
   an orthographic projection of the opening structure on the flexible printed circuit and orthographic projections of the line layers on the flexible printed circuit do not overlap.

5. The flexible printed circuit according to claim 4, wherein a thickness of the flexible printed circuit in the bent region is less than a thickness of the flexible printed circuit in the flat and straight region.

6. The flexible printed circuit according to claim 5, wherein the line layers are arranged on the circuit bonding region, the bent region and the flat and straight region of the flexible printed circuit; and
   a quantity of the line layers in the bent region is less than a quantity of the line layers in the flat and straight region.

7. The flexible printed circuit according to claim 4, wherein the flexible printed circuit further comprises: ink layers arranged on sides, which deviate from the flexible circuit substrate, of the line layers.

8. A flexible apparatus, comprising: the flexible printed circuit according to claim 1.

9. The flexible apparatus according to claim 8, wherein the flexible apparatus further comprises: a flexible target substrate having a substrate bonding region, and the circuit bonding region of the flexible printed circuit is electrically connected to the substrate bonding region.

10. The flexible apparatus according to claim 9, wherein the flexible target substrate further comprises: sunken structures close to two sides of the circuit bonding region of the flexible printed circuit in the second direction.

11. The flexible apparatus according to claim 9, wherein the flexible apparatus further comprises: a flexible electroluminescent display panel;
    wherein the flexible target substrate is arranged on a light emitting side of the flexible electroluminescent display panel; or
    the flexible target substrate is an array substrate in the flexible electroluminescent display panel.

12. The flexible apparatus according to claim 8, wherein the flexible target substrate further comprises: a display region and a touch electrode arranged in the display region.

13. A display device, comprising: the flexible apparatus according to claim 8.

14. The flexible printed circuit according to claim 1, wherein the flexible printed circuit comprises: a flexible circuit substrate; and the opening structure penetrates the flexible circuit substrate.

* * * * *